United States Patent
Brooks

(10) Patent No.: US 10,781,980 B2
(45) Date of Patent: Sep. 22, 2020

(54) LED MODULE HOUSING

(71) Applicant: Anthem Displays, LLC, Boulder, CO (US)

(72) Inventor: Evan D. Brooks, Boulder, CO (US)

(73) Assignee: Anthem Displays, LLC, Boulder, CO (US)

( * ) Notice: Subject to any disclaimer, the term of this patent is extended or adjusted under 35 U.S.C. 154(b) by 0 days.

(21) Appl. No.: 15/716,257

(22) Filed: Sep. 26, 2017

(65) Prior Publication Data

US 2018/0017993 A1 Jan. 18, 2018

Related U.S. Application Data

(63) Continuation of application No. 14/756,321, filed on Aug. 25, 2015, now Pat. No. 9,772,655.

(60) Provisional application No. 62/041,498, filed on Aug. 25, 2014.

(51) Int. Cl.
| | |
|---|---|
| *F21K 9/60* | (2016.01) |
| *G06F 1/16* | (2006.01) |
| *H01L 25/075* | (2006.01) |
| *F21Y 105/00* | (2016.01) |

(52) U.S. Cl.
CPC .............. *F21K 9/60* (2016.08); *G06F 1/1601* (2013.01); *H01L 25/0753* (2013.01); *F21Y 2105/00* (2013.01)

(58) Field of Classification Search
CPC . G02F 1/133608; G02F 1/1335; G02F 1/1601
See application file for complete search history.

(56) References Cited

U.S. PATENT DOCUMENTS

| | | | | |
|---|---|---|---|---|
| 5,949,581 A | * | 9/1999 | Kurtenbach | G09F 9/33 359/619 |
| 7,178,967 B2 | * | 2/2007 | Kim | G02F 1/133308 349/58 |
| 7,796,208 B2 | * | 9/2010 | Ho | G02F 1/133603 349/58 |
| 7,988,321 B2 | * | 8/2011 | Wung | F21V 19/0035 362/218 |
| 8,350,788 B1 | * | 1/2013 | Nearman | G09F 9/3026 315/169.3 |
| 8,992,037 B2 | * | 3/2015 | Rycyna, III | F21V 19/00 362/812 |
| 9,772,655 B1 | | 9/2017 | Brooks | |
| 2008/0143918 A1 | * | 6/2008 | Kim | G02F 1/133608 349/58 |
| 2009/0262542 A1 | * | 10/2009 | Li | F21V 3/00 362/373 |

(Continued)

OTHER PUBLICATIONS

Official Action for U.S. Appl. No. 14/756,321, dated Oct. 5, 2016 11 pages.

(Continued)

*Primary Examiner* — Julie A Bannan
(74) *Attorney, Agent, or Firm* — Sheridan Ross P.C.

(57) ABSTRACT

A light-emitting diode (LED) display module including a back panel substantially formed of a material having a thermal expansion that is less than plastic used in injection molding, a housing that frames the back panel comprised of one or more plastic molded parts, and a front face having a louver is disclosed.

20 Claims, 10 Drawing Sheets

(56) References Cited

U.S. PATENT DOCUMENTS

| | | | |
|---|---|---|---|
| 2010/0165627 A1* | 7/2010 | Wung | F21S 2/005 362/249.02 |
| 2012/0182739 A1* | 7/2012 | Leung | F21S 2/005 362/249.06 |
| 2013/0051016 A1 | 2/2013 | Boyer et al. | |
| 2013/0148351 A1* | 6/2013 | Georgitsis | F21V 21/14 362/239 |
| 2013/0265752 A1 | 10/2013 | Shimizu | |
| 2013/0271993 A1* | 10/2013 | Jan | F21V 21/30 362/249.09 |

OTHER PUBLICATIONS

Notice of Allowance for U.S. Appl. No. 14/756,321, dated May 31, 2017 9 pages.

\* cited by examiner

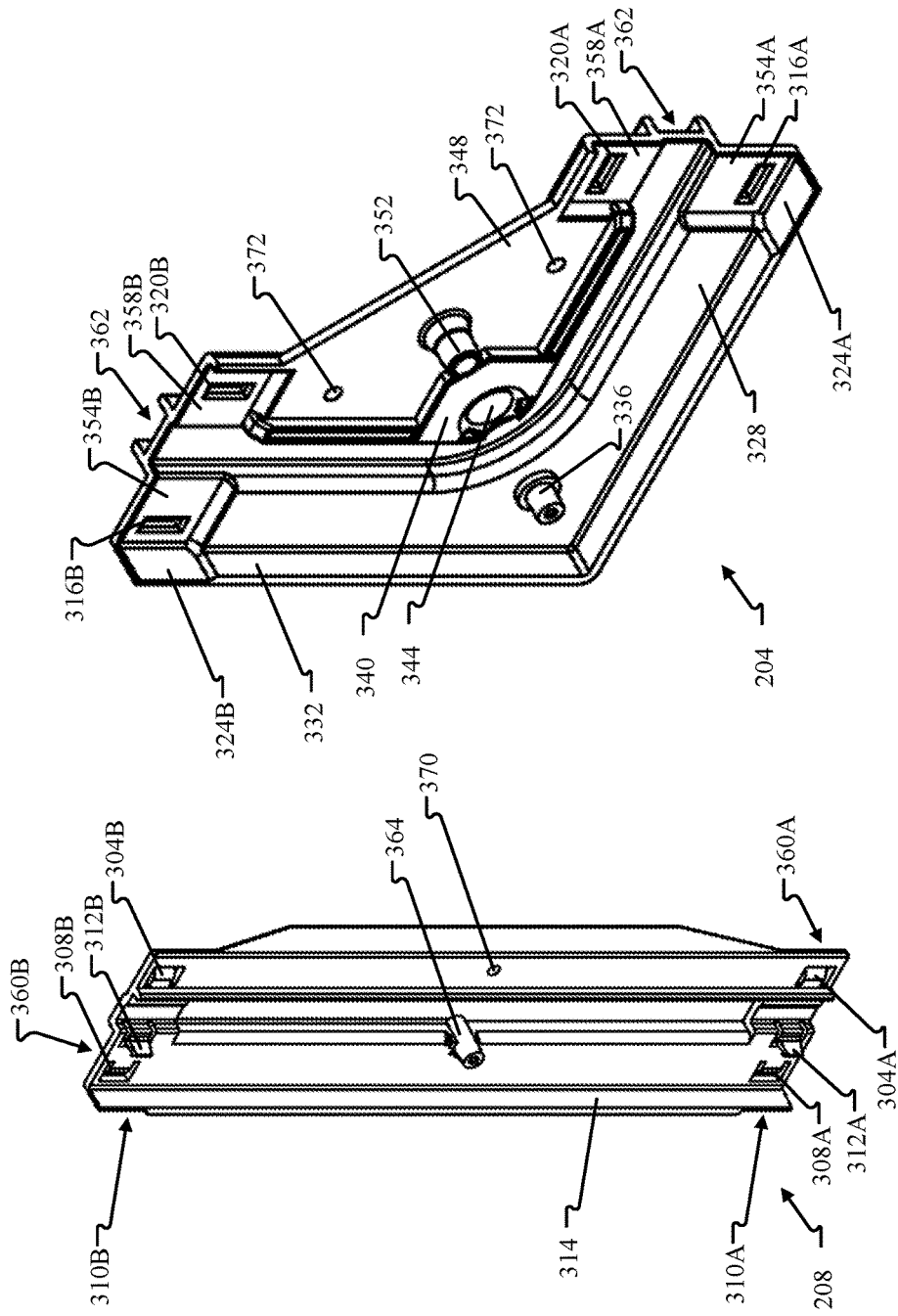

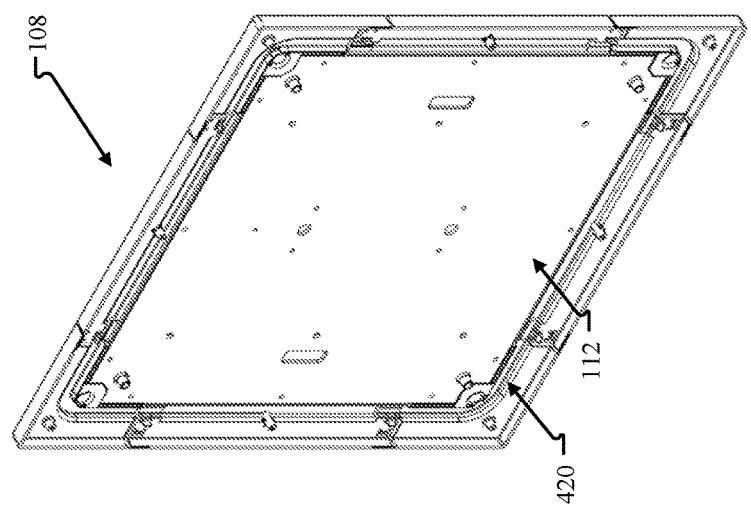
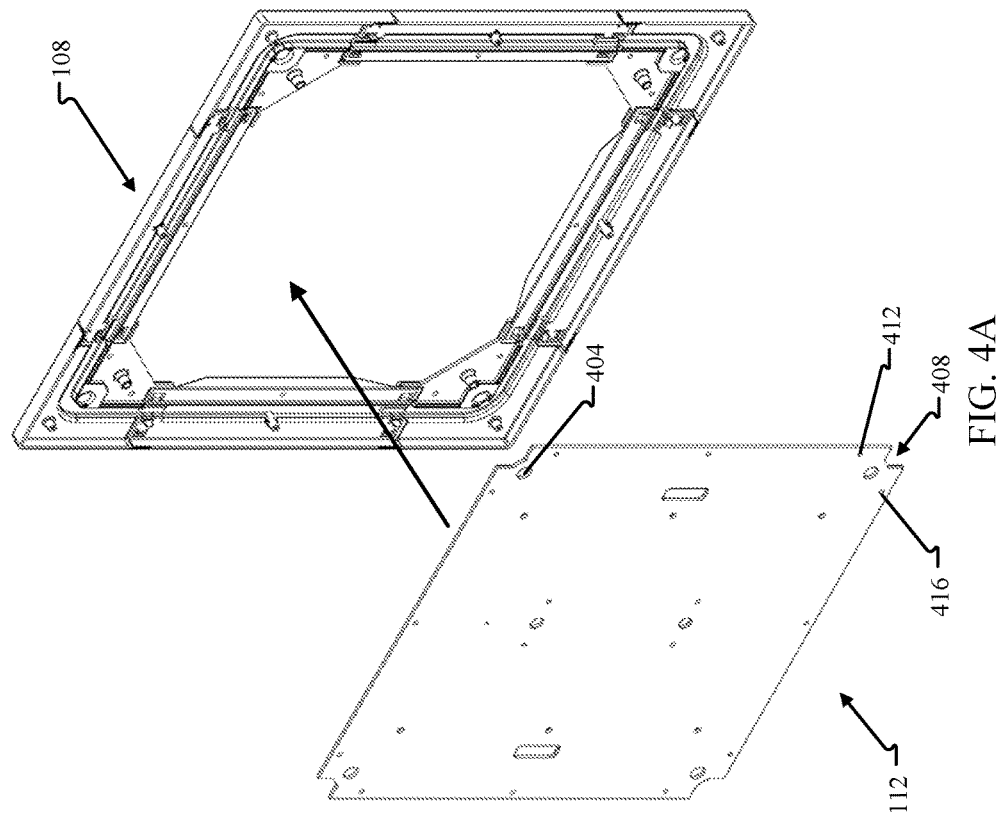
FIG. 4A
FIG. 4B

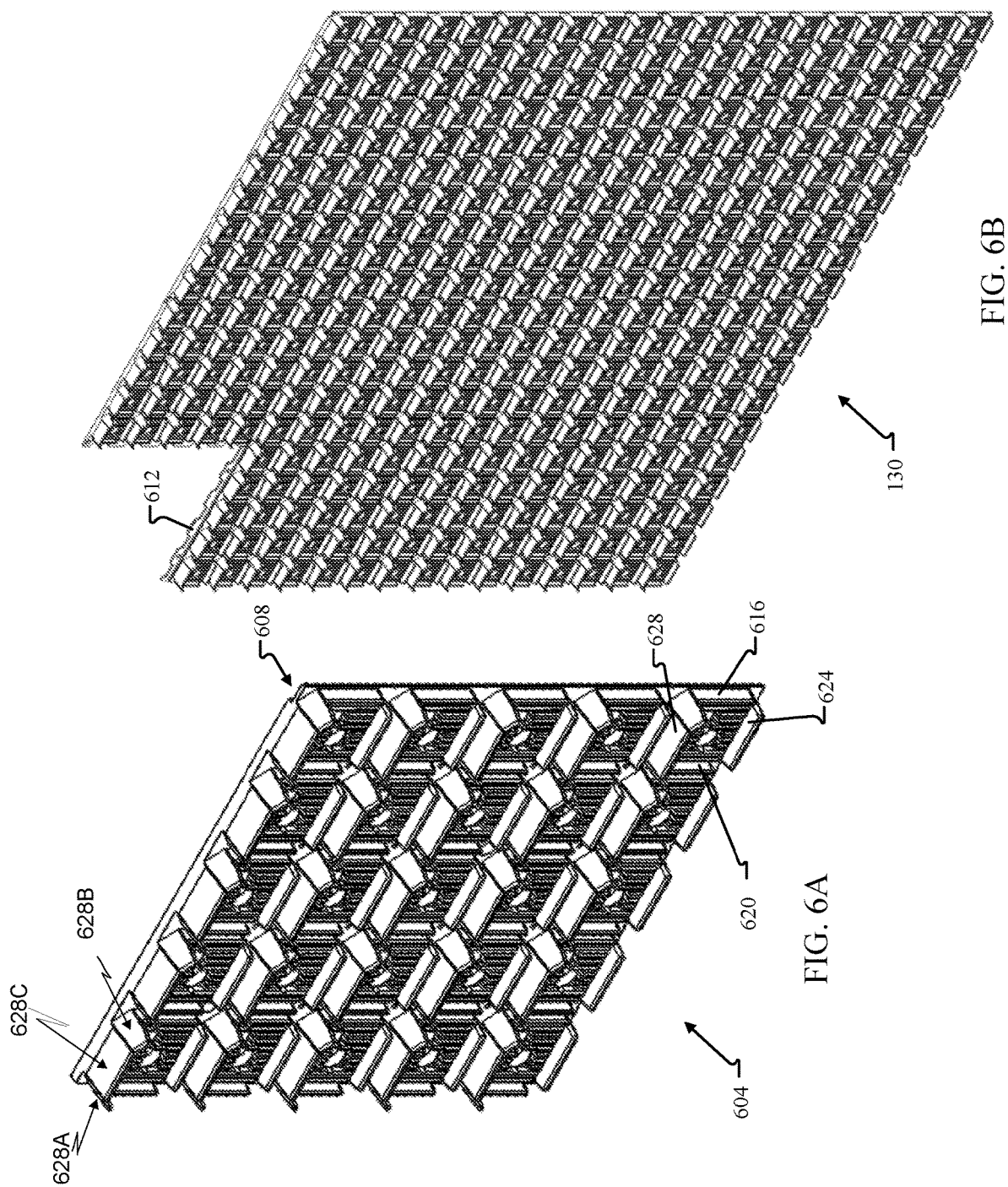

LED MODULE HOUSING

CROSS-REFERENCE TO RELATED APPLICATIONS

This application is a continuation of U.S. patent application Ser. No. 14/756,321, filed Aug. 25, 2015, now U.S. Pat. No. 9,772,655, which claims the benefit of U.S. Provisional Patent Application Ser. No. 62/041,498, filed Aug. 25, 2014, the entire disclosures of which are hereby incorporated herein by reference for all that they teach and for all purposes.

FIELD OF THE INVENTION

The disclosure relates to a light-emitting diode (LED) display module.

BACKGROUND

Light-emitting diode (LED) display modules generally include a plurality of pixels, such that when a plurality of LED display modules are arranged together in a panel for example, a larger LED display may be formed.

SUMMARY

In accordance with embodiments of the present disclosure, an LED housing including a housing frame made of four corner pieces and four edge pieces is disclosed. In particular, the housing frame is assembled so as to accommodate a housing back panel. The housing back panel may be made of a different material than that of the frame; for example, the housing back panel may be made of a material having a lower thermal expansion coefficient than the material comprising the housing frame. Further, one or more components of the housing frame may be made from an injection molded part. For example, the corner and the edge parts of the housing frame may be made according to a plastic injection molding process.

In accordance with embodiments of the present disclosure, the LED display module may include features that allow two display modules to be stacked for shipping. As one example, the modules are stacked back-to-back with one rotated 90 degrees from the other such that the handles interlock with one another.

In accordance with embodiments of the present disclosure, a light-emitting diode (LED) display module is provided. The light-emitting display module may include a back panel substantially formed of a material having a thermal expansion that is less than plastic used in injection molding, a housing that frames the back panel comprised of one or more plastic molded parts, and a front face having a louver.

Further, and in accordance with some embodiments, a light-emitting diode (LED) display is provided. The light-emitting diode display may include a plurality of (LED) display modules, each LED display module including a back panel substantially formed of a material having a thermal expansion that is less than plastic used in injection molding, a housing that frames the back panel comprised of one or more plastic molded parts, and a front face having a louver.

Further still, and in accordance with some embodiments, a louver is provided, which includes two or more rectangular tiles, each adjacent tile having mating tabs extending from one or two edges, which are bonded to corresponding mating recesses on the adjacent tile.

Accordingly, it is these and other advantages that will be apparent from the disclosure.

The phrases "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

The term "a" or "an" entity refers to one or more of that entity. As such, the terms "a" (or "an"), "one or more" and "at least one" can be used interchangeably herein. It is also to be noted that the terms "comprising", "including", and "having" can be used interchangeably.

BRIEF DESCRIPTION OF THE DRAWINGS

The accompanying drawings are incorporated into and form a part of the specification to illustrate several examples of the present disclosure. These drawings, together with the description, explain the principles of the disclosure. The drawings simply illustrate preferred and alternative examples of how the disclosure can be made and used and are not to be construed as limiting the disclosure to only the illustrated and described examples. Further features and advantages will become apparent from the following, more detailed, description of the various aspects, embodiments, and configurations of the disclosure, as illustrated by the drawings referenced below.

FIGS. 3A-3B illustrate additional details with respect to an edge part and a corner part in accordance with embodiments of the present disclosure;

FIG. 4A illustrates an exploded isometric view of an assembled housing frame and back panel in accordance with embodiments of the present disclosure;

FIG. 4B illustrates an isometric view of a housing frame assembled with a back panel in accordance with embodiments of the present disclosure;

FIGS. 6A-B illustrate a partially exploded isometric view of a louver assembly in accordance with embodiments of the present disclosure;

DETAILED DESCRIPTION

The ensuing description provides embodiments only and is not intended to limit the scope, applicability, or configuration of the claims. Rather, the ensuing description will provide those skilled in the art with an enabling description for implementing the embodiments. It being understood that various changes may be made in the function and arrangement of elements without departing from the spirit and scope of the appended claims.

Figure 1A:
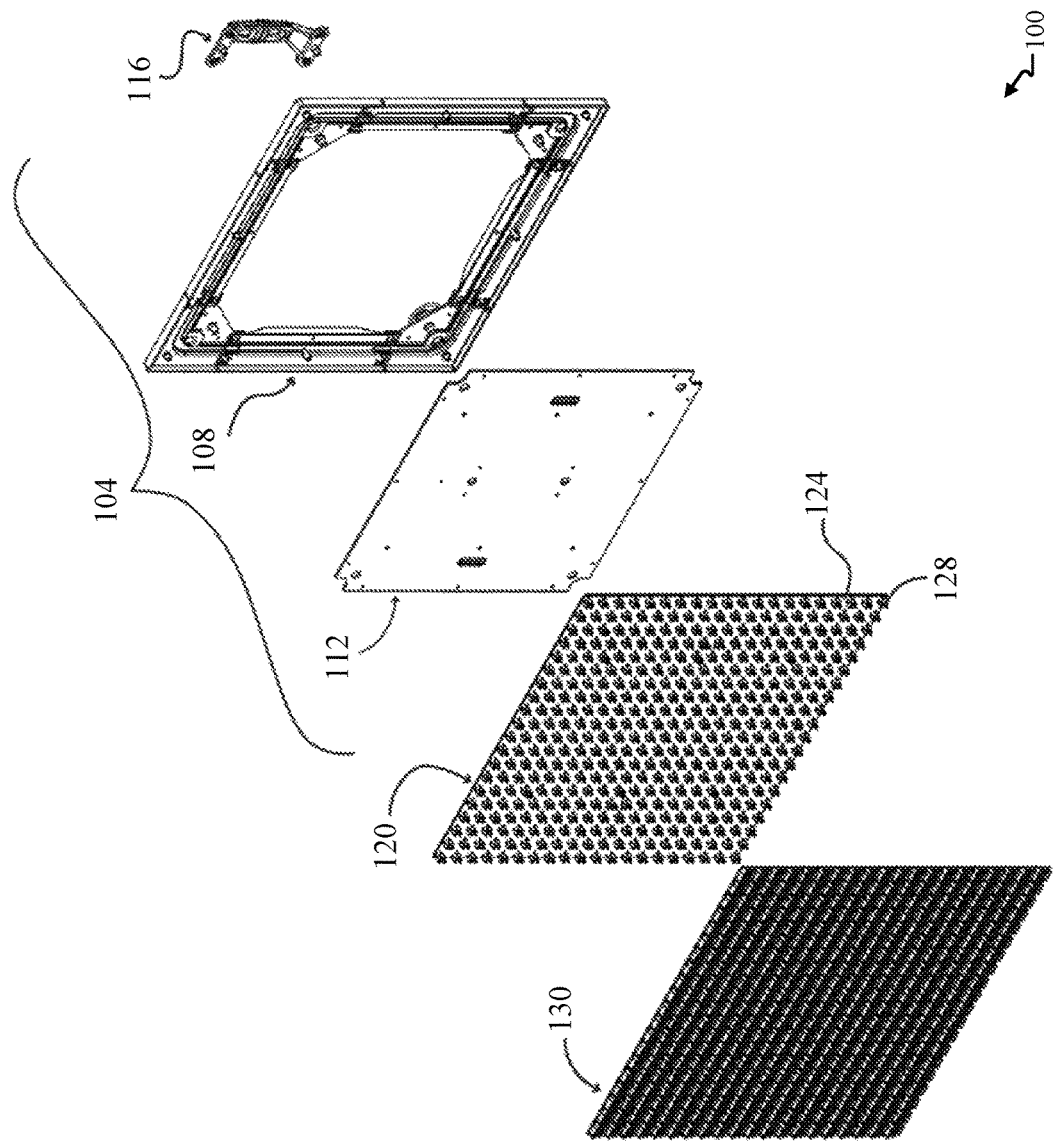
FIG. 1A illustrates an exploded isometric view of an LED display module in accordance with embodiments of the present disclosure.

FIG. 1A generally illustrates a light-emitting diode (LED) display module 100 in accordance with at least one embodiment of the present disclosure. The LED display module 100 generally includes an LED housing 104, a Printed Circuit Board (PCB) assembly 120, and a louver 130. The LED housing 104 may include a housing frame 108, housing back panel 112, and a handle 116. The PCB assembly 120 is generally contained within the LED housing 104 and is covered by the louver 130. The PCB assembly 120 may include a PCB 124, a plurality of LEDs 128, and various electronic components, not shown, to power and control the display mounted and electrically connected to the printed circuitry. The PCB assembly 120 of the LED display module 100 may generally include 400 pixels arrayed in twenty columns and twenty rows, where each pixel generally includes three LEDs 128. Each LED 128 of the pixel may output a separate color of light when powered. That is, a first LED may be a blue LED and may output blue light; a second LED may be a red LED and may output red light, and a third LED may be a green LED and output green light. Alternatively, or in addition, each LED may be a multicolor LED and may be capable of outputting multiple colors of light. Alternatively, or in addition, other colors of LEDs are contemplated. The LEDs 128 may cooperate to provide a spectrum of colors when one or more of the LEDs in a pixel are lit at varying intensities. Although illustrated as including 400 pixels, each of the number pixels, LEDs, rows, and columns of the LED display module 100 may be more or less. The PCB assembly 120 may be covered on one or both sides with a sealing material, such as potting material, to protect the PCB assembly 120 from the effects and elements of weather, such as rain and snow. The PCB assembly 120 may be secured to the housing back panel 112 in a variety of manners. For instance, one or more fasteners may secure the PCB assembly 120 to the housing back panel 112. As will be discussed below, the louver 130 generally provides shading for each of the pixels included in the PCB assembly 120. Accordingly, the louver 130 generally includes an LED pass-through hole for each of the LEDs in the PCB assembly 120.

Figure 1B:
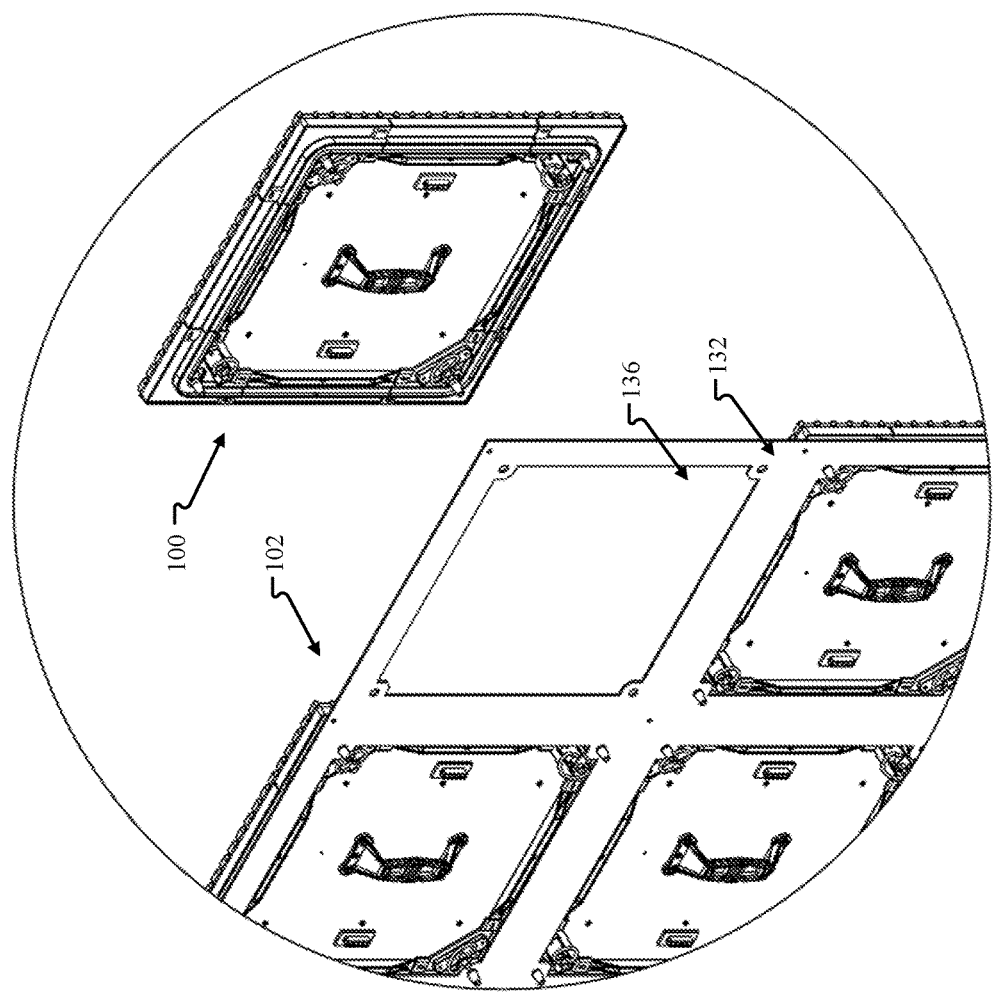
FIG. 1B illustrates an isometric view of an LED display in accordance with embodiments of the present disclosure.

As illustrated in FIG. 1B, a plurality of LED display modules 100 may be mounted adjacent to one another forming an LED display 102. The LED display 102 may include any number of LED display modules 100 arrayed in the form of a matrix. The LED display 102 generally includes one or more panels 132 having an array of openings 136; in each of the openings 136, an LED display module 100 may be secured to the panel 136 utilizing one or more fasteners. An array of LED display modules 100, such as in an LED display 102, may be utilized for the purpose of creating large displays, such as billboards or other displays used for advertising. In accordance with at least one embodiment of the present disclosure, each of the LED display modules 100 is removable through the opening 136 to which it is attached. That is, the LED display module 100 may be removed from the backside of the panel 132.

Figure 2:
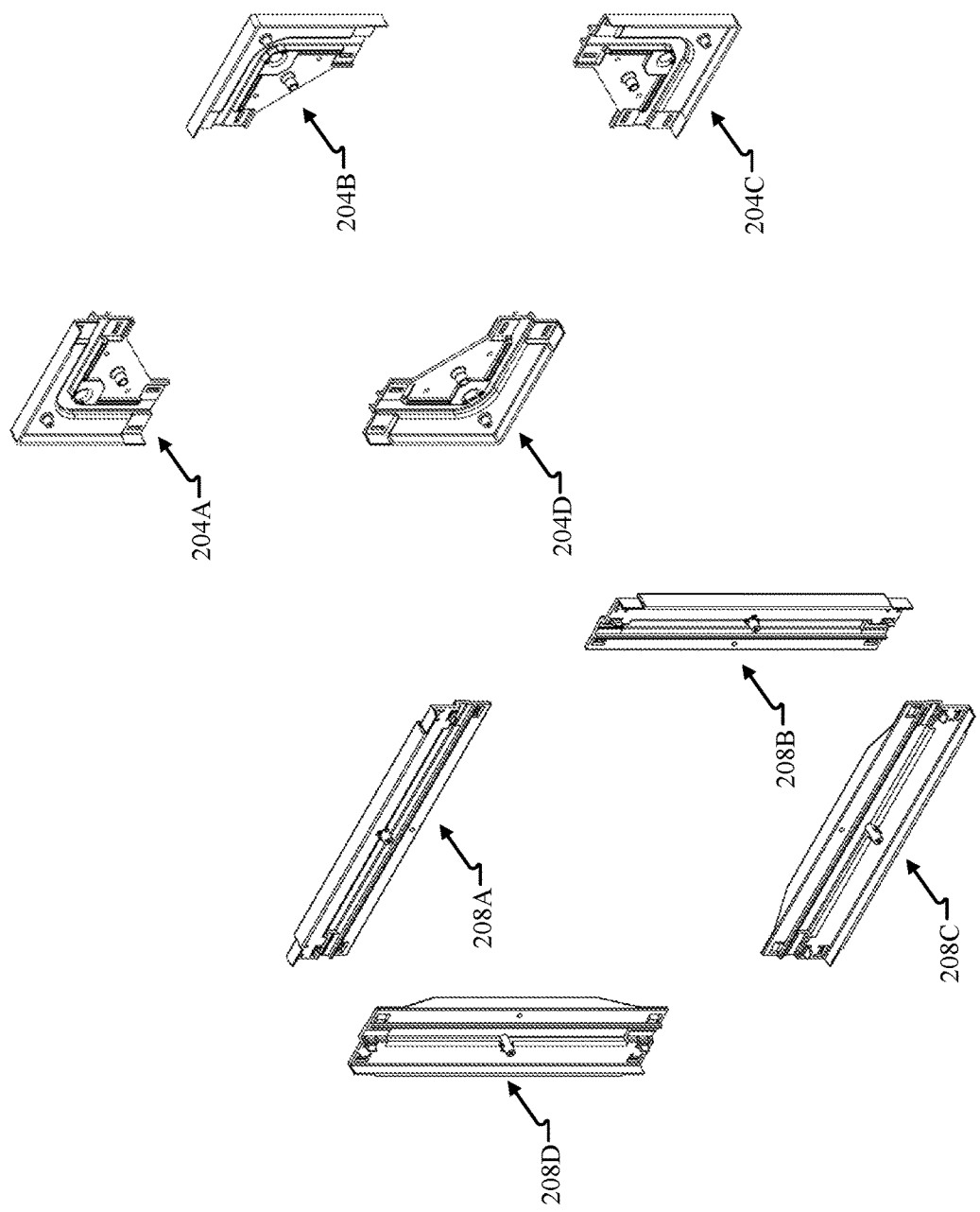
FIG. 2 illustrates an exploded view of a housing frame in accordance with embodiments of the present disclosure.

The housing frame 108 is generally constructed with four corner parts 204A-D and four edge parts 208A-D. The housing frame 108 is shaped so as to accept the housing back panel 112; the housing back panel 112 being attached to the housing frame 108. As illustrated in FIG. 2, each of the corner parts 204A-D may be identical to one another. Similarly, each of the edge parts 208A-D may be identical to one another. Accordingly, the housing frame 108 may include only two non-identical types of parts. That is, a first edge part 208A may be fastened to a first corner part 204A and a second corner part 204B. A second edge part 208B may be fastened to the second corner part 204B and a third corner part 204C. A third edge part 208C may be fastened to the third corner part 204C and a fourth corner part 204D. And a fourth edge part 208D may be fastened to the fourth corner part 204D and the first corner part 204A. In accordance with embodiments of the present disclosure, an edge part 208 may be connected to one or both corner parts 204 using snap hooks as the fastener. Other fasteners include, but are not limited to, rivets, screws, adhesives, tabs, clips, and plugs.

In accordance with embodiments of the present disclosure, each of the edge parts 208A-D and each of the corner parts 204A-D may be created using various molding techniques, three-dimensional printing techniques, and/or combinations thereof. That is, each of the corner parts 204A-D and edge parts 208A-D may be created out of a plastic material, for example by utilizing plastic injection molding techniques, plastic compression molding techniques, or the like. Examples of materials that the corner parts 204A-D and the edge parts 208A-D can be molded from are polymeric materials including moldable polymers, thermo-formable polymers, or thermoplastic polymers, such as at least one of, but not limited to, a polycarbonate (PC) and acrylonitrile butadiene styrene (ABS), or non-polymeric materials, such as steel, aluminum, and magnesium. Moreover, examples of materials that the corner parts 204A-D and the edge parts 208A-D can be three-dimensionally printed from include, but are not limited to, acrylonitrile butadiene styrene (ABS), polyethylene terephthalate (PET), Carbon Fiber Reinforced PLA, Steel PLA, and other PLA-containing materials. Of course, other techniques are contemplated for creating the corner parts 204A-D and the edge parts 208A-D. For example, each of the corner parts 204A-D and the edge parts 208A-D may be created using one or more milling, baking, and/or stamping techniques.

FIGS. 3A-3B provide additional details with respect to an edge part 204 and a corner part 208 in accordance with embodiments of the present disclosure. More particularly, and as provided in FIG. 3A, the edge part 208 may include a snap hook 304A and/or 304B at one or both ends. In addition, the edge part 208 may include a snap hook 308A and/or 308B at one or both ends. Further, the edge part 208 may include a snap hook 312A and/or 312B at one or both ends. The edge part 208 may further include an edge part housing frame rim 314, an edge mating side surface 310A-B, and an edge mating bottom surface 360A-B. The edge part 208 may further include a boss 364 for securing the louver 130, a fastener hole 370, and a gasket gutter on the back side (not shown). One or more of the snap hooks 304A-B, 308A-B, and/or 312A-B, the boss 364, the fastener hole 370, the edge part housing frame rim 314, and a gasket gutter may be integrally formed with the edge part 208. For example, one or more of the snap hooks 304A-B, 308A-B, and/or 312A-B, the boss 364, the fastener hole 370, the edge part housing frame rim 314, and a gasket gutter may be smoothly continuous in form such that any components making up the edge part 208 have been rendered inseparable from the edge part 208.

As depicted in FIG. 3B, the corner part 204 generally includes a housing frame surface 328 configured to receive an end portion of the edge part 208. For example, the corner part 204 may include a slot 316A-B at one or both ends. That is, a slot 316A may be formed in the corner mating bottom surface 354A. Further, a slot 316B may be formed in the corner mating bottom surface 354B. Alternatively, or in addition, a slot 320A may be formed in the corner mating bottom surface 354A and/or a slot 320B may be formed in the corner mating bottom surface 358B. Accordingly, the snap hook 304A and snap hook 308A of the edge part 208 may be configured to engage the slot 320B and slot 316B, respectively, of the corner part 204, such that the edge part 208 is fastened to the corner part 204. Thus, the edge mating bottom surface 360A may be in contact with or otherwise fastened to the corner mating bottom surfaces 354B and 358B and the edge mating side surface 310A is in contact with the corner mating side surface 324B. Likewise, the snap hook 304B and snap hook 308B of the edge part 208 may be configured to engage the slot 320A and slot 316A, respectively, of the corner part 204, such that the edge part 208 is fastened to another corner part 204. Thus, the edge mating bottom surface 360B may be in contact with or otherwise fastened to the corner mating bottom surfaces 354A and 358A and the edge mating side surface 310B is in contact with the corner mating side surface 324A. When the edge part 208 and the corner part 204 are fastened together, the edge part housing frame rim 314 and the corner part housing frame rim 332 form a substantially continuous housing frame rim; accordingly, as depicted in at least FIGS. 4A-4B, the housing frame rim is substantially continuous about the perimeter of the housing frame 108. The housing frame 108 also forms a substantially continuous gutter creating a constant planar surface for the application of a gasket without any elevation step changes, which would negatively impact the functionality of the gasket.

The corner part 204 may further include a housing back panel support 348, which is configured to receive or otherwise contact the housing back panel 112, as will be described with respect to FIGS. 4A-4B. The corner part 204 may additionally include a latch actuator passage 352 and a back panel corner alignment feature 340 further configured to contact the housing back panel 112 and further align the housing back panel 112 with respect to the corner part 204. The latch actuator passage 352 may also include a through-hole and allow a latch actuator tool to pass through such that a latch, fastening the housing back panel 112 to the housing frame 108, may be actuated. The corner part 204 may also include a protrusion feature 504, of which the inner surface portion 344 is illustrated. The protrusion feature 504 may be used to locate the LED display module 100 installed on the mounting panel 132.

Similar to edge part 208, the corner part 204 may further include a boss 336. The corner part 204 may also include one or more fastener holes in the housing back panel support 348. One or more of the slots 316A-B, slots 320A-B, boss 336, protrusion features 504, latch actuator passages 352, housing back panel supports 348, corner part housing frame rims 332, and gasket gutter 362, may be integrally formed with the corner part 204. For example, one or more of the slots 316A-B, slots 320A-B, boss 336, protrusion features 504, latch actuator passages 352, housing back panel supports 348, corner part housing frame rims 332, and gasket gutter 362 may be smoothly continuous in form such that any components making up the corner part 204 have been rendered inseparable from the corner part 204.

Although the snap hooks 304A-B, snap hooks 308A-B, and snap hooks 312A-B are depicted as being part of the edge part 208, such disclosure should not be considered limiting. For example, one or more of the snap hooks 304A-B, snap hooks 308A-B, and snap hooks 312A-B may be formed or otherwise be a part of the corner part 204. Further, one or more of the slots 316A-B and/or the slots 320A-B configured to receive a snap hook may be formed or otherwise part of the edge part 208A-D. Although snap hooks and slots are illustrated, it should be understood that other fastening means are contemplated and may be utilized accordingly.

The fastener hole 370 may accommodate a rivet to attach the edge part to the housing back panel 112. In addition, the housing back panel support 348 includes two rivet holes 372. Rivets that go through these two holes 372 may combine the helical latch (508), the housing back panel 112, and the corner part 204, while also further securing the edge part 208 by clamping it between the corner part 204 and the housing back panel 112.

FIGS. 4A-B generally illustrate an exploded and assembled view, respectively, of the housing frame 108 and housing back panel 112 in accordance with embodiments of the present disclosure. As depicted in FIG. 4, the housing back panel 112 may sit within an inner rim 420 formed by the corner parts 204A-D and the edge parts 208A-D. Further, the housing back panel 112 may include one or more latch actuator passage holes 404 and fastener holes 412 and 416 near the corner. The housing back panel corner section 408 includes a locating feature, such as a relief, chamfer, and/or fillet configured to engage with an edge portion of the back panel corner alignment feature 340.

In accordance with at least one embodiment of the present disclosure, the housing back panel 112 is comprised mostly of an aluminum blank, which is a byproduct of the panel 132 that the module mounts to. For example, if the panel 132 is made of aluminum, the blank resulting from the opening 136 is utilized to create the housing back panel 112. Since outdoor LED displays are subject to extreme temperatures, the expansion of the materials used to construct the LED display modules 100 over the range from extreme cold to extreme heat needs to be taken into account so that the modules, which are tiled two-dimensionally, accommodate internal differences in thermal expansion between unlike materials, and are also sized so that when they expand they do not collide with adjacent LED display modules 100. Accordingly, using aluminum in place of injection molded plastic, having a lower thermal expansion, enables the use of larger LED display modules 100, without appreciably increasing the gap between the LED display modules 100 that would otherwise be needed to accommodate the corresponding increase in LED display module 100 expansion at elevated temperatures. Larger LED display modules 100 reduce total cost per square area by better leveraging costs that are fixed or increase less than proportionally to the increase in area of the LED display module 100. As one example, the thermal expansion coefficient of ABS is around $73.8 \times 10^{-6}$ m/(m K)., while the thermal expansion coefficient of aluminum is $22.2 \times 10^{-6}$ m/(m K). As another example, the thermal expansion coefficient of Polycarbonate (PC) is around 70.2×10-6 m/(m K).

The fewer number of LED display modules 100 resulting from the larger LED display module 100 size reduces the handling when installing or replacing LED display modules 100 from the face of the panel 132, or cabinet, which provides a labor cost savings.

The PCB 124 of the PCB assembly 120 has thermal expansivity much more similar to aluminum than the plastic currently used as the mounting substrate for the PCB 124. This closer correlation reduces stresses on the PCB 124, improving reliability.

The aluminum, being greatly more thermally conductive than plastic, improves the dissipation of heat away from the back of the PCB 124, reducing component operating temperatures, which improves energy efficiency and reduces component failure, increasing lifespan.

Figure 5:
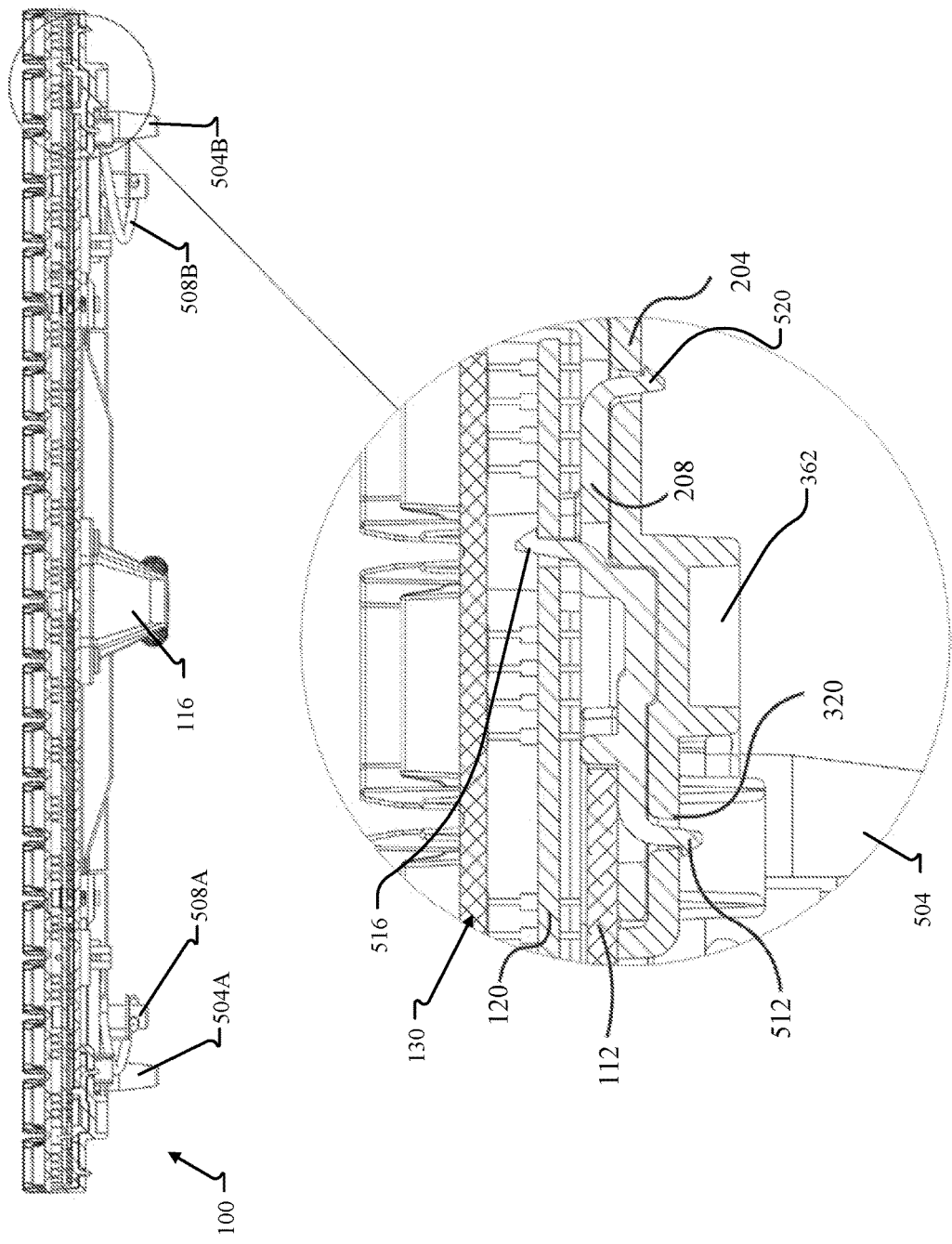
FIG. 5 illustrates a cross section view of the LED display module in accordance with embodiments of the present disclosure.

FIG. 5 generally provides a cross section view of the LED display module 100 in accordance with embodiments of the present disclosure. As depicted in FIG. 5, the outside surface portion of a protruding feature 504 is illustrated. Additional details of the protruding feature 504 will be provided with respect to FIG. 9. As illustrated in FIG. 5, the LED display module 100 and the edge part 208 is secured to the corner part 204 utilizing snap hooks 520 and 512. Snap hook 520 may the same as or similar to snap hook 308. Snap hook 512 may be same as or similar to snap hook 304 and may protrude through the slot 320 thereby securing the edge part 208 to the corner part 204. The PCB assembly 120 may be secured to the housing frame 108 using the snap hook 516, which may be the same as or similar to the snap hook 312. The louver 130 may be secured to or otherwise coupled to the PCB assembly 120 utilizing one or more fasteners and fastening holes.

FIG. 6B depicts additional details of a louver 130 in accordance with embodiments of the present disclosure. In particular, the louver 130 may be assembled from two or more louver tiles 604. Although depicted as including sixteen louver tiles 604, the louver 130 may include more than sixteen or less than sixteen louver tiles 604. For example, one or more louver tile 604 may be configured to accommodate one-hundred pixels, instead of twenty-five. Accordingly, four louver tiles 604 may be utilized in the louver 130. Each louver tile 604 may include mating tabs 612 extending from one or more sides of the louver tile 604, which when assembled, overlap with corresponding mating recesses 608. The overlapping faces form a bonding interface and provide a means to combine the louver tiles 604 into a full-sized louver 130.

As depicted in FIG. 6A, the louver tile 604 may include side louver blades 616 and 620 and upper and lower louver blades 628 and 624 for each pixel. The upper louver blades 628 include laterally spaced end sections or wings 628A and 628B at opposite sides of a center section 628C that are angled downwardly relative to the center section 628C. Alternatively, or in addition, one or more pixels may share louver blades 616-628. In addition, multiple side louver blades may be present between the side louver blades 616 and 620. Each louver blade 616-628 provides a shading feature to one or more of the corresponding pixels comprising one or more LED 168. Accordingly, performance of the LED 168 may be improved as direct sunlight reaching an LED 168 may be blocked or otherwise reduced.

Figure 7B:
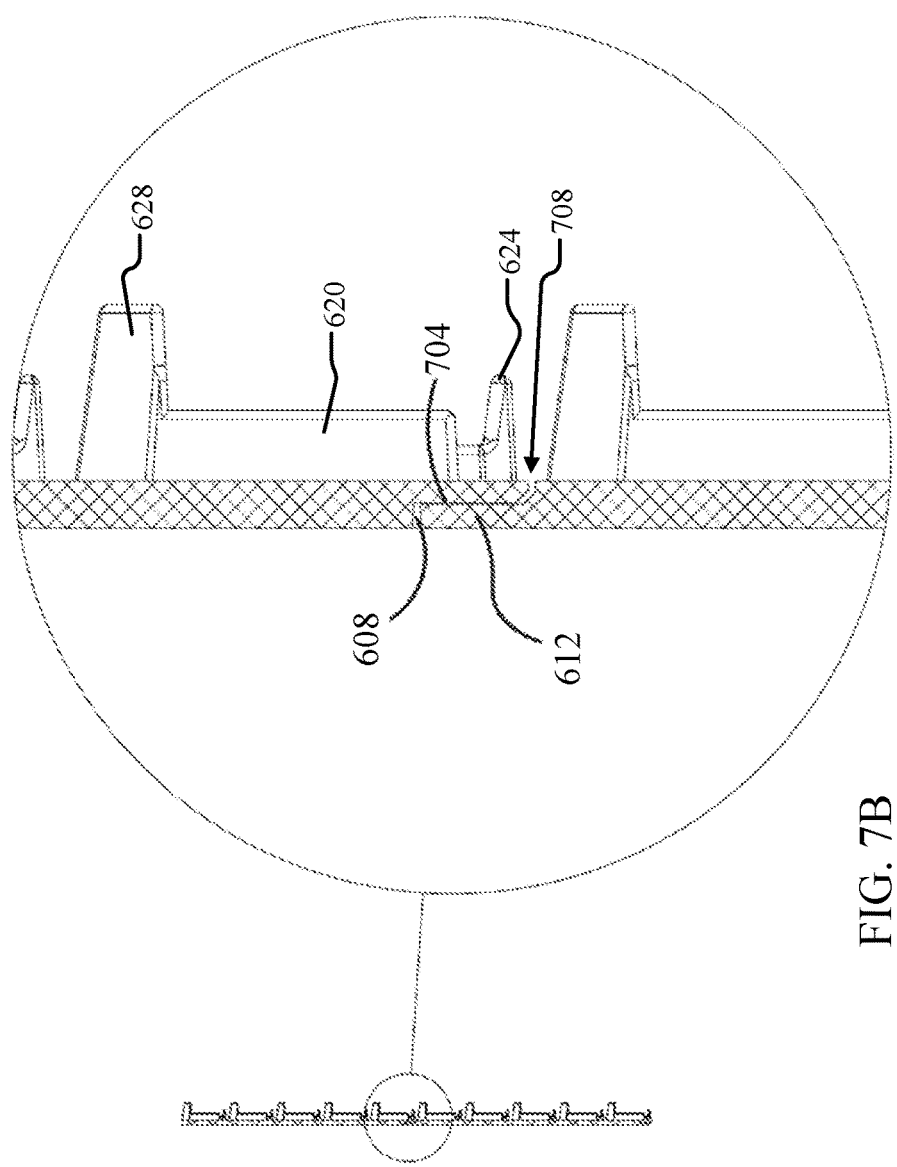
FIG. 7B illustrates a cross sectional view of the louver section along the A-A in accordance with embodiments of the present disclosure.
Figure 7A:
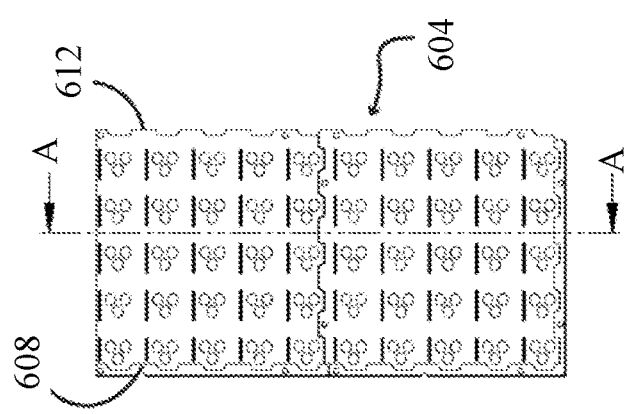
FIG. 7A illustrates a rear plan view of a section of the louver showing two tiles in accordance with embodiments of the present disclosure.

FIGS. 7A-B provide additional details with respect to the assembly of the louver 130 with a plurality of louver tiles 604. FIG. 7B is a cross-sectional view of a louver section along the line A-A of FIG. 7A in accordance with embodiments of the present disclosure. As previously discussed, each louver tile 604 may include mating tabs 612 extending from one or more sides of the louver tile 604, which when assembled, overlap with corresponding mating recesses 608 of another louver tile 604. The overlapping faces of the mating recess 608 and mating tabs 612 form a bonding interface 704 and provide a means to combine the louver tiles 604 into a full-sized louver 130. Accordingly, a bonding material, such as an adhesive can be added at location 708 and, by wicking action, the mating recess 608 and the mating tab 612 may be bonded together.

Figure 8:
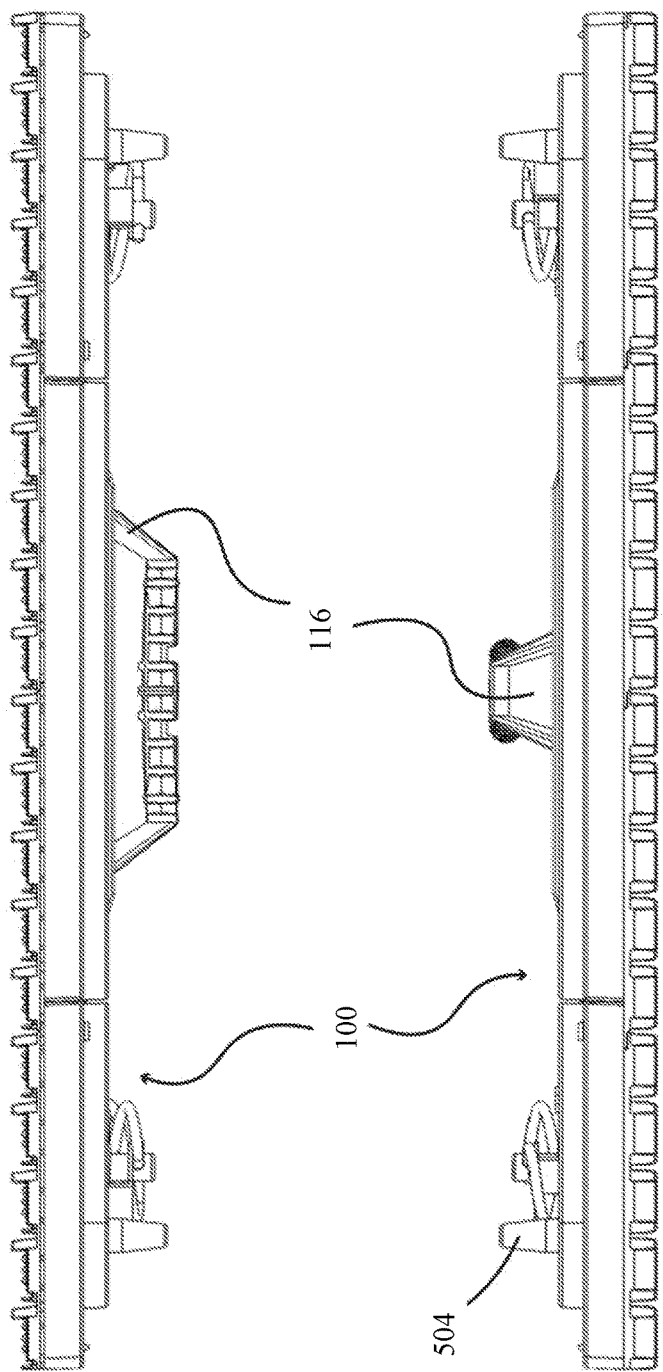
FIG. 8 illustrates a side plan view of two LED display modules oriented back-to-back with one of the LED display modules oriented 90 degrees relative to the other in accordance with embodiments of the present disclosure.
Figure 9:
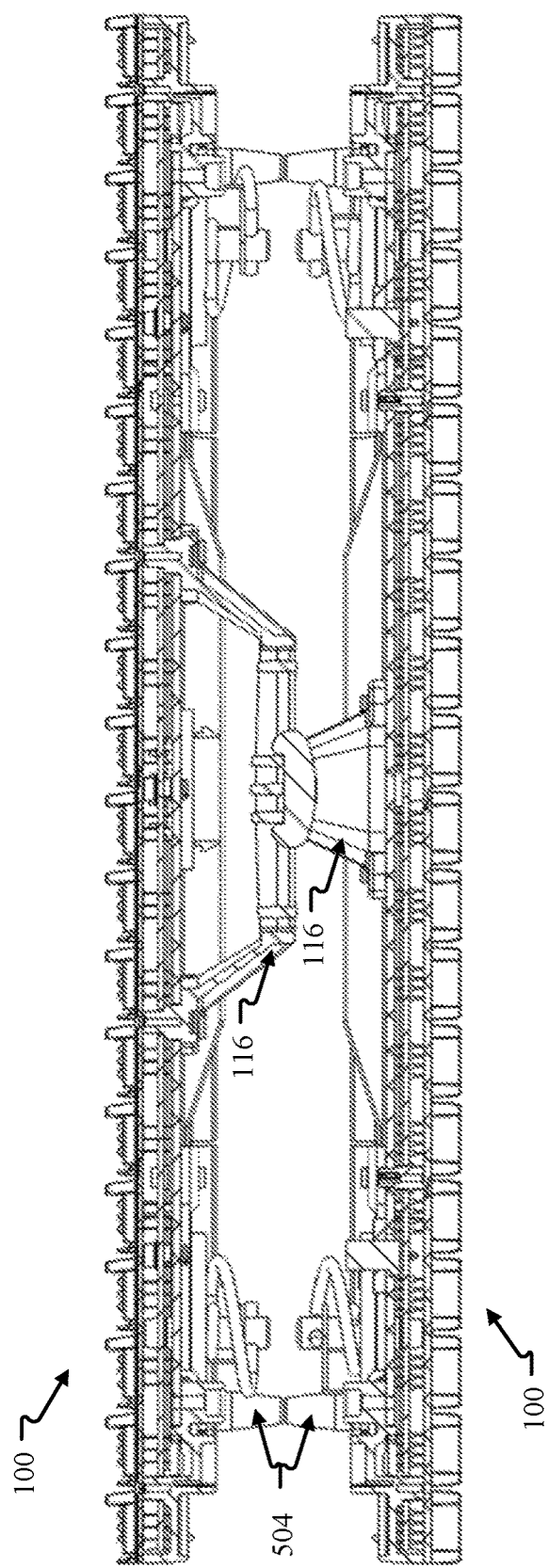
FIG. 9 illustrates a cross sectional view of the two LED display modules of FIG. 8 stacked one upon the other in accordance with embodiments of the present disclosure.

The LED display module 100 may include features to allow for two or more modules to be stacked for shipping with minimal packaging materials as provided in FIGS. 8 and 9. For example, the handle 116 may be shaped so as to interlock with itself when two modules are stacked back-to-back and rotated 90 degrees. As illustrated in FIG. 8, the bottom LED display module 100 is rotated 90 degrees with respect to the top LED display module 100. Accordingly, the protruding features 504 formed as part of the housing frame 108 may be dimensioned so that when two modules are stacked in this orientation, they make contact with corresponding protruding features 504 on the opposite LED display module 100 as illustrated in FIG. 9.

The present disclosure, in various aspects, embodiments, and/or configurations, includes components, methods, processes, systems and/or apparatuses substantially as depicted and described herein, including various aspects, embodiments, configurations, sub combinations, and/or subsets thereof. Those of skill in the art will understand how to make and use the disclosed aspects, embodiments, and/or configurations after understanding the present disclosure. The present disclosure, in various aspects, embodiments, and/or configurations, includes providing devices and processes in the absence of items not depicted and/or described herein or in various aspects, embodiments, and/or configurations thereof, including in the absence of such items as may have been used in previous devices or processes, e.g., for improving performance, achieving ease and/or reducing cost of implementation.

The foregoing discussion has been presented for purposes of illustration and description. The foregoing is not intended to limit the disclosure to the form or forms disclosed herein. In the foregoing for example, various features of the disclosure are grouped together in one or more aspects, embodiments, and/or configurations for the purpose of streamlining the disclosure. The features of the aspects, embodiments, and/or configurations of the disclosure may be combined in alternate aspects, embodiments, and/or configurations other than those discussed above. This method of disclosure is not to be interpreted as reflecting an intention that the claims require more features than are expressly recited in each claim. Rather, as the following claims reflect, inventive aspects lie in less than all features of a single foregoing disclosed aspect, embodiment, and/or configuration. Thus, the following claims are hereby incorporated into this disclosure, with each claim standing on its own as a separate preferred embodiment of the disclosure.

Moreover, though this disclosure has included a description of one or more aspects, embodiments, and/or configurations and certain variations and modifications, other variations, combinations, and modifications are within the scope of the disclosure, e.g., as may be within the skill and knowledge of those in the art, after understanding the present disclosure. It is intended to obtain rights, which include alternative aspects, embodiments, and/or configurations to the extent permitted, including alternate, interchangeable and/or equivalent structures, functions, ranges, or steps to those claimed, whether or not such alternate, interchangeable and/or equivalent structures, functions, ranges or steps are disclosed herein, and without intending to publicly dedicate any patentable subject matter.

What is claimed is:

1. A light-emitting diode (LED) display module comprising:
   a back panel substantially formed of a first material having a first thermal expansion;

a housing frame formed of a second material having a second thermal expansion that is greater than the first thermal expansion;

a front face including a louver, the louver including a plurality of upper louver blades arranged in a first horizontal row and a plurality of lower louver blades arranged in a second horizontal row, the upper and lower louver blades extending horizontally outwardly from the louver, a size of the upper louver blades is different from a size of the lower louver blades, each of the plurality of upper louver blades have a planar center section having first and second laterally spaced ends, a first end section positioned at the first end of the center section and a second end section positioned at the second end of the center section, the first and second end sections angled downwardly relative to the center section and wherein each individual lower louver blade of the plurality of louver blades is oriented vertically below a different individual upper louver blade of the plurality of upper louver blades and define a plurality of horizontally oriented pixel locations;

a printed circuit board between the louver and the back panel, the printed circuit board including a plurality of LEDs, wherein at least one LED of the plurality of LEDs is positioned at each pixel location; and a handle attached to the back panel, wherein the handle protrudes from a surface of the back panel in a direction that is perpendicular to the surface of the back panel.

2. The LED display module according to claim 1, wherein the first material includes aluminum.

3. The LED display module according to claim 1, wherein the handle includes receiving features configured to receive another handle from a different LED display module of the same construction when the LED display module is rotated 90 degrees with respect to an orientation of the handle of the different LED display module and stacked in a back-to-back configuration.

4. The LED display module according to claim 1, further comprising protruding features near corners of the housing frame.

5. The LED display module according to claim 4, wherein each of the protruding features are configured to contact protruding features of a different LED display module of the same construction when stacked in a back-to-back configuration.

6. A light-emitting diode (LED) display module comprising:

a back panel substantially formed of a first material having a first thermal expansion;

a housing frame formed of a second material having a second thermal expansion that is greater than the first thermal expansion, protruding features near corners of the housing frame.

a front face including a louver, the louver including a plurality of upper louver blades and a plurality of lower louver blades, each of the plurality of upper louver blades having a first end section and a second end section laterally spaced from the first end section and a horizontally oriented center section positioned between the first and second end sections, the first and second end sections disposed at an angle relative to the center section, a size of the upper louver blades is different from a size of the lower louver blades, and wherein each individual lower louver blade of the plurality of louver blades is oriented vertically below a different individual upper louver blade of the plurality of upper louver blades and together each individual upper louver blade and associated lower louver blade define a pixel location;

a printed circuit board between the louver and the back panel, the printed circuit board including a plurality of LEDs, wherein at least one LED of the plurality of LEDs is positioned at each pixel location; and protruding features near corners of the housing frame.

7. The LED display module according to claim 6, wherein each of the protruding features are configured to contact protruding features a different LED display module of the same construction when stacked in a back-to-back configuration.

8. The LED display module according to claim 6, wherein the first material includes aluminum.

9. The LED display module according to claim 6, further comprising a handle attached to the back panel, wherein the handle protrudes from a surface of the back panel in a direction that is perpendicular to the surface of the back panel.

10. The LED display module according to claim 9, wherein the handle includes receiving features configured to receive another handle from a different LED display module of the same construction when the LED display module is rotated 90 degrees with respect to an orientation of the handle of the different LED display module and stacked in a back-to-back configuration.

11. A light-emitting diode (LED) display including:

a panel; and a plurality of LED display modules mounted to the panel, each LED display module including:

a back panel substantially formed of a first material having a first thermal expansion;

a housing frame formed of a second material having a second thermal expansion that is greater than the first thermal expansion;

a front face including a louver, the louver including a plurality of upper louver blades and a plurality of lower louver blades extending outwardly from the louver, the plurality of upper louver blades having a horizontally oriented center section, a first end section and a second end section spaced from the first end section with the center section positioned between the first and second end sections;

a printed circuit board between the louver and the back panel, the printed circuit board including a plurality of LEDs, wherein at least one LED of the plurality of LEDs is between each upper louver blade of the plurality of upper louver blades and a lower louver blade of the plurality of lower louver blades, and wherein the position of the first and second end sections of each upper louver blade of the plurality of upper louver blades is different from the position of the center section relative to the associated at least one LED; and a handle attached to the back panel, wherein the handle protrudes from a surface of the back panel in a direction that is perpendicular to the surface of the back panel.

12. The LED display according to claim 11, wherein the first material includes aluminum.

13. The LED display according to claim 11, wherein the handle of each LED display module of the plurality of display modules includes receiving features configured to receive another handle from a different LED display module of the same construction when the LED display module is rotated 90 degrees with respect to an orientation of the handle of the different LED display module and stacked in a back-to-back configuration.

14. The LED display according to claim 11, further comprising protruding features near corners of the housing frame.

15. The LED display according to claim 14, wherein the protruding features are configured to contact protruding features of a different LED display module of the same construction when stacked in a back-to-back configuration.

16. The LED display according to claim 11, wherein each LED display module of the plurality of LED display modules include protruding features near four corners of the housing frame configured to contact protruding features of the different LED display module when stacked in a back-to-back orientation such that the protruding features and handle of the LED display module contact the corresponding protruding features and handle of the different LED display module.

17. The LED display according to claim 11, wherein the handle of each LED display module extends through the panel to which the corresponding LED display module is mounted.

18. The LED display according to claims 11, wherein each back panel of each LED display module is a cut-out from the panel to which the LED display module is mounted.

19. The LED display module according to claim 18, wherein the cut-out is a same size and shape as an opening formed in the panel.

20. The LED display module according to claim 11, wherein a size of the upper louver blades is different from a size of the lower louver blades.

\* \* \* \* \*